(12) United States Patent
Volpert et al.

(10) Patent No.: US 8,704,545 B2
(45) Date of Patent: Apr. 22, 2014

(54) DETERMINATION OF PROPERTIES OF AN ELECTRICAL DEVICE

(75) Inventors: Gilbert Volpert, Wertheim (DE); Victor Romanov, Wertheim (DE)

(73) Assignee: DTG International GmbH, Zurich (CH)

( * ) Notice: Subject to any disclaimer, the term of this patent is extended or adjusted under 35 U.S.C. 154(b) by 365 days.

(21) Appl. No.: 13/124,454

(22) PCT Filed: Oct. 14, 2009

(86) PCT No.: PCT/EP2009/063413
§ 371 (c)(1),
(2), (4) Date: Apr. 15, 2011

(87) PCT Pub. No.: WO2010/043651
PCT Pub. Date: Apr. 22, 2010

(65) Prior Publication Data
US 2011/0199112 A1 Aug. 18, 2011

(30) Foreign Application Priority Data
Oct. 15, 2008 (AT) ................. A 1620/2008

(51) Int. Cl.
*G01R 31/00* (2006.01)
(52) U.S. Cl.
USPC .................................................. 324/756.05
(58) Field of Classification Search
USPC ............... 324/762.01–762.1, 750.01–750.3, 324/756.01–756.07; 257/48; 438/14–18
See application file for complete search history.

(56) References Cited

U.S. PATENT DOCUMENTS

| | | | |
|---|---|---|---|
| 4,565,966 A | 1/1986 | Burr et al. | |
| 5,268,645 A | 12/1993 | Prokoff et al. | |
| 5,744,964 A | 4/1998 | Sudo et al. | |
| 5,903,160 A | 5/1999 | Ianenko et al. | |
| 5,977,776 A | 11/1999 | Huth et al. | |
| 6,842,029 B2* | 1/2005 | Howland | 324/750.25 |
| 7,227,370 B2* | 6/2007 | Kasukabe | 324/754.15 |
| 7,323,870 B2 | 1/2008 | Tatschl et al. | |
| 2008/0254572 A1 | 10/2008 | Leedy | |

FOREIGN PATENT DOCUMENTS

| | | |
|---|---|---|
| DE | 34 08 704 A1 | 9/1984 |
| DE | 199 04 751 C1 | 7/2000 |
| DE | 10 2005 047 413 A1 | 9/2006 |
| EP | 0 508 062 A1 | 10/1992 |

(Continued)

OTHER PUBLICATIONS

International Search Report, dated Apr. 9, 2010, corresponding to PCT/EP2009/063413, 14 pages.

*Primary Examiner* — Tung X Nguyen
(74) *Attorney, Agent, or Firm* — Christie, Parker & Hale, LLP

(57) ABSTRACT

A device and method of determining the electrical properties of an electrical device, including taking of at least one measurement of an electrical measured quantity at one or more brought-out electrical connections of each of several equipotential bodies of the electrical device, wherein measurement of the electrical measured quantity of certain equipotential bodies on at least one other brought-out electrical connection of the equipotential body concerned is not performed if a defect, which if appropriate is to be detected, of the relevant equipotential body in the area of this other connection, influences the electrical measured quantity more strongly than a tolerance of the measurement of this measured quantity.

27 Claims, 7 Drawing Sheets

(56) References Cited

FOREIGN PATENT DOCUMENTS

| EP | 0 772 054 A2 | 5/1997 |
| EP | 0 853 242 A1 | 7/1998 |
| WO | WO 2006/008746 A2 | 1/2006 |
| WO | WO 2006/133808 A1 | 12/2006 |

* cited by examiner

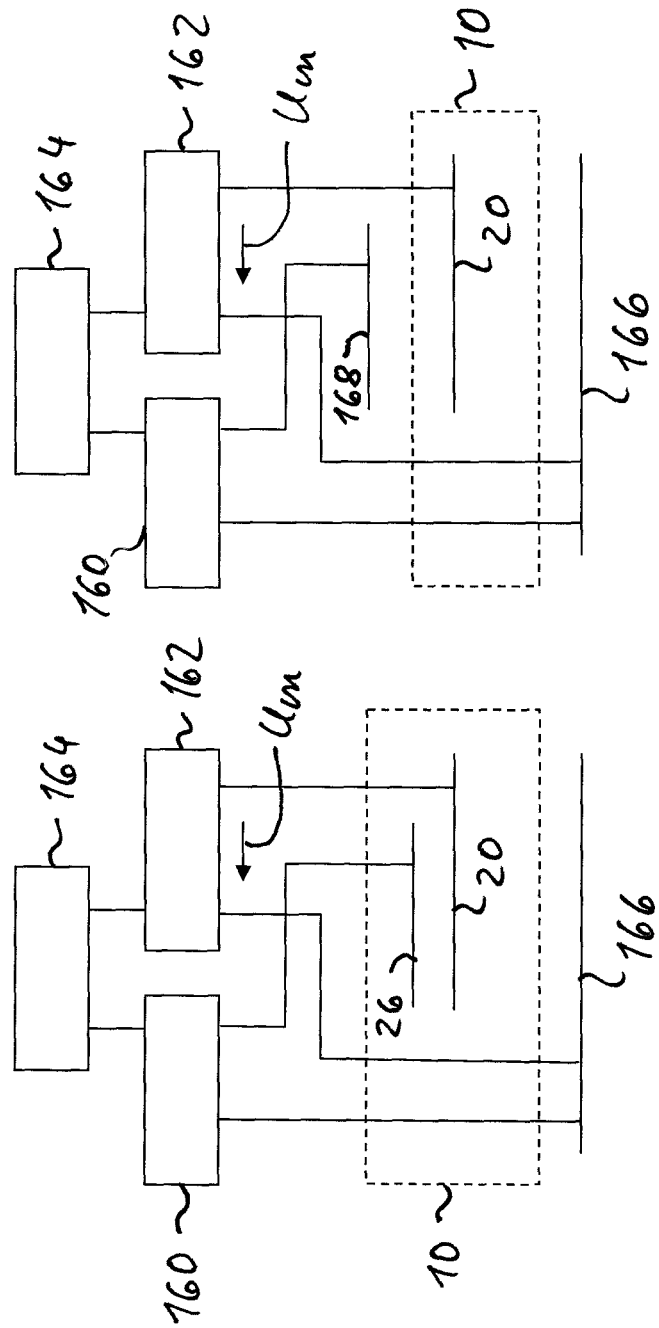

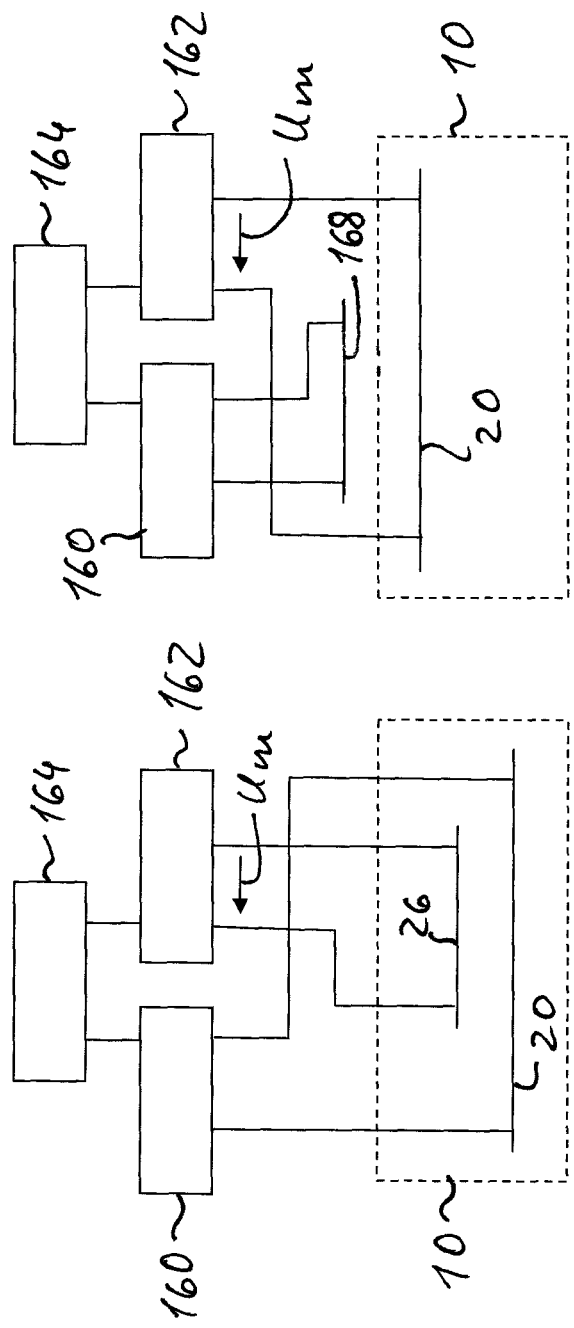

DETERMINATION OF PROPERTIES OF AN ELECTRICAL DEVICE

CROSS-REFERENCE TO RELATED APPLICATION(S)

This application is a National Phase Patent Application and claims the priority of International Application Number PCT/EP2009/063413, filed on Oct. 14, 2009, which claims priority of Austrian Patent Application Number A 1620/2008, filed on Oct. 15, 2008.

BACKGROUND OF THE INVENTION

The present invention relates to a method of determining the electrical properties of an electrical device, wherein the method comprises the following steps: taking of a measurement of an electrical measured quantity at one or more brought-out electrical connections of each of several equipotential bodies of the electrical device.

An example of an electrical device with electrical properties to be determined by the method according to the invention is for example described in DE 199 04 751 C1. Here, an equipotential body is understood to mean a part of the electrical device, the surface of which forms an equipotential surface at least when no alternating voltage and no alternating field are applied to the equipotential surface. At the same time the equipotential body and therefore also its surface may be partly or wholly embedded in other parts of the electrical device, thus creating an internal surface of the equipotential body which is at least partly invisible from the surroundings of the electrical device. Typically, the equipotential body is a two-dimensional object, so that its length amounts to at least a hundred times, preferably a thousand times its thickness. The individual equipotential bodies of the electrical device may—in comparison with one another—have quite different forms. An equipotential body may have a shape which is disc-like, rectangular, meandering, spiral, star-like, multistar-like, grid-like and/or branched in some other way. Typically the equipotential body is made of a doped semiconductor or of a metal such as copper, silver, gold or aluminum or of a metal alloy. Here, "connection" means a part of the equipotential body accessible from a surface of the electrical device.

EP 0 853 242 A 1 describes a method for the testing of circuit boards in which several nets of a circuit board are short-circuited, and the nets short-circuited with one another are tested together for short-circuits against other nets.

10 EP 0 508 062 A 1 defines a field measurement method in which a conductor configuration is subjected to an electrical field, and at least one electrical potential forming in the conductor configuration due to the electrical field is tapped by measuring probes at the individual test points, and compared with the potential of other test points and/or with a reference.

EP 0 772 054 A2 discloses a method in which firstly, in a first measuring process, a first conductor configuration is tested by means of a field measurement, wherein complex conductances for the individual nets are determined with the aid of the field measurement. In the subsequent measuring processes of further conductor configurations, the complex conductances of the conductor paths are measured and compared with the complex conductances determined previously.

WO 2006/133808 A1 relates to a method in which non-componented, extensive circuit boards are tested using a finger tester. In this method, the circuit boards are tested divided into several segments, wherein conductor paths which extend beyond a segment are tested by means of capacitive measurement of the end points located in the segment concerned.

U.S. Pat. No. 5,744,964 discloses a device for the measurement of conductor configurations in which the individual nets of the conductor configurations may be measured by means of a resistance measurement or a capacitance measurement. In the capacitance measurement, two nets independent of one another are each contacted by a test probe, and the capacitance between these two test probes is measured.

Described in DE 34 08 704 A 1 is a device for the testing of circuit configurations in which nets of the circuit configuration are tested by means of a capacitive measurement. The capacitive measurement is effected with reference to a conductive board which is separated from the circuit configuration by means of a dielectric, insulating board.

SUMMARY OF THE INVENTION

The present invention also relates to a device for determining electrical properties of an electrical device.

Using conventional methods, checking the freedom from defects of equipotential surfaces of electrical devices takes a great deal of time, so that the throughput of the costly measuring equipment and of its efficiency are limited.

A problem of the present invention is to improve the throughput of the individual 15 measuring device without increasing the cost of the apparatus involved.

This problem is solved by the features of the independent claims 1 and 15.

Advantageous embodiments of the invention are set out in the dependent claims.

The invention is based on a method of the type described above for determining the electrical properties of an electrical device of the type described above, in which measurement of the electrical measured quantity of certain equipotential bodies on at least one other brought-out electrical connection of the equipotential body concerned is not performed if a defect, which is if appropriate to be detected, of the relevant equipotential body in the area of this other connection, influences the electrical measured quantity more strongly than a tolerance of the measurement of this measured quantity.

This means that the measurement of the electrical measured quantity of certain equipotential bodies on at least one other brought-out electrical connection of the equipotential body concerned is conducted only if a defect, which may require detection, of the equipotential body concerned in the area of this other connection does not influence the electrical measured quantity more strongly than a tolerance of the measurement of this measured quantity. Therefore, all other connections of a certain equipotential body are measured only if their potential minimum fault is less than the tolerance of a previous measurement of the electrical measured quantity at this equipotential body.

The potential minimum faults which may be measured at certain connections of the equipotential body, are measurable at individual connections without a connection to the equipotential body, or may be calculated or estimated with the aid of CAD data and material data. They are therefore available for certain types of connection.

The percentage measuring error of the measurement is known to the person skilled in the art and depends on the measuring electronics used. The tolerance for a certain equipotential body arises from the set value of the measured quantity for the equipotential body concerned and the percentage measuring error. The set values of the measured quantities of the individual equipotential bodies are determined for example in advance on a fault-free electrical device. From this, the tolerances of the individual equipotential bodies may be determined. These are therefore available during implementation of the method.

Before conducting a measurement on another connection, a check is made as to whether a measurement at this connection may be omitted. Since the relevant values for the tolerances and the potential minimum faults are generally already available before the method is implemented, this check may be carried out before the first measurement of the measured quantities of all equipotential bodies is conducted. Preferably this check is made in the course of drawing up a test sequence in which it is determined which connections will be measured and in what order, so that such a test sequence may then be followed with significantly fewer measurements than in the prior art.

In a preferred embodiment, a level of influencing of the electrical measured quantity during execution of the method is determined statistically by means of measurements on a preferably representative number of similar electrical devices.

In another preferred embodiment, a measuring tolerance to be used as a basis for the measurements is determined by means of a calibration measurement on at least one equipotential body with exemplary dimensions.

It is also advantageous if initial measurements are made on the basis of an initial measuring tolerance, with a measuring tolerance statistically determined from the first measurements being used for subsequent measurements.

In accordance with an advantageous development of the method according to the invention it is provided that, during individual measurements in each case between two or more equipotential bodies, a temporary electrical connection is created by means of an electrical component and a common measurement is made on the temporarily electrically connected equipotential bodies.

Especially advantageous is an embodiment in which the electrical component substantially forms an electrical conductor.

The measurements may include conductance and/or capacitance and/or propagation time measurements, and/or electrical field measurements and/or magnetic field measurements and/or electromagnetic field measurements.

In a similarly preferred embodiment, the measurements include the measurement of an amount, an angle, a real component and/or an imaginary component of a four-pole parameter of the conductance form, the resistance form, the chain form and/or the hybrid form.

In a further embodiment, a set value of a measured value of the measurement and/or a tolerance of the measured value of the measurement during implementation of the method are determined statistically by means of measurements on a preferably representative number of similar electrical devices.

During measurement, the electrical device may be subjected to an electrical, a magnetic and/or an electromagnetic field, at least for a time and at least in some areas.

In an especially preferred embodiment, the field is an inhomogeneous field and/or a field which is stationary for at least part of the time and/or a field which is not stationary for at least part of the time.

Preferably at least one of the equipotential bodies of the electrical device is connected to a current or voltage supply, in order to generate the electrical and/or electromagnetic field.

In a further preferred embodiment, the level of influence on the electrical measured quantity is dependent on an expansion of volume and/or an expansion in area and/or and extension of length and/or on a specific conductivity and/or on a number of contact points and/or on a number of test points and/or on a number of holes in the equipotential body concerned and/or on a material encompassing the equipotential body concerned.

The device according to the invention is based on a device of the type described above by providing that it determines the electrical properties of the electrical device by means of the method according to the invention.

BRIEF DESCRIPTION OF THE DRAWINGS

The invention is explained in detail below with the aid of typical examples, as illustrated in the appended drawings. The drawings show in:

FIGS. 7 and 8 are examples of measuring set-ups with four-pole measurements, wherein an electrical input field is generated by means of a measuring voltage source and an electrical potential difference is detected by means of a voltmeter; and FIGS. 9 and 10 are examples of measuring set-ups with four-pole measurements, wherein the four-pole is operated as a magnetically-coupled high-frequency transformer.

DETAILED DESCRIPTION OF THE DRAWINGS

Figure 1:
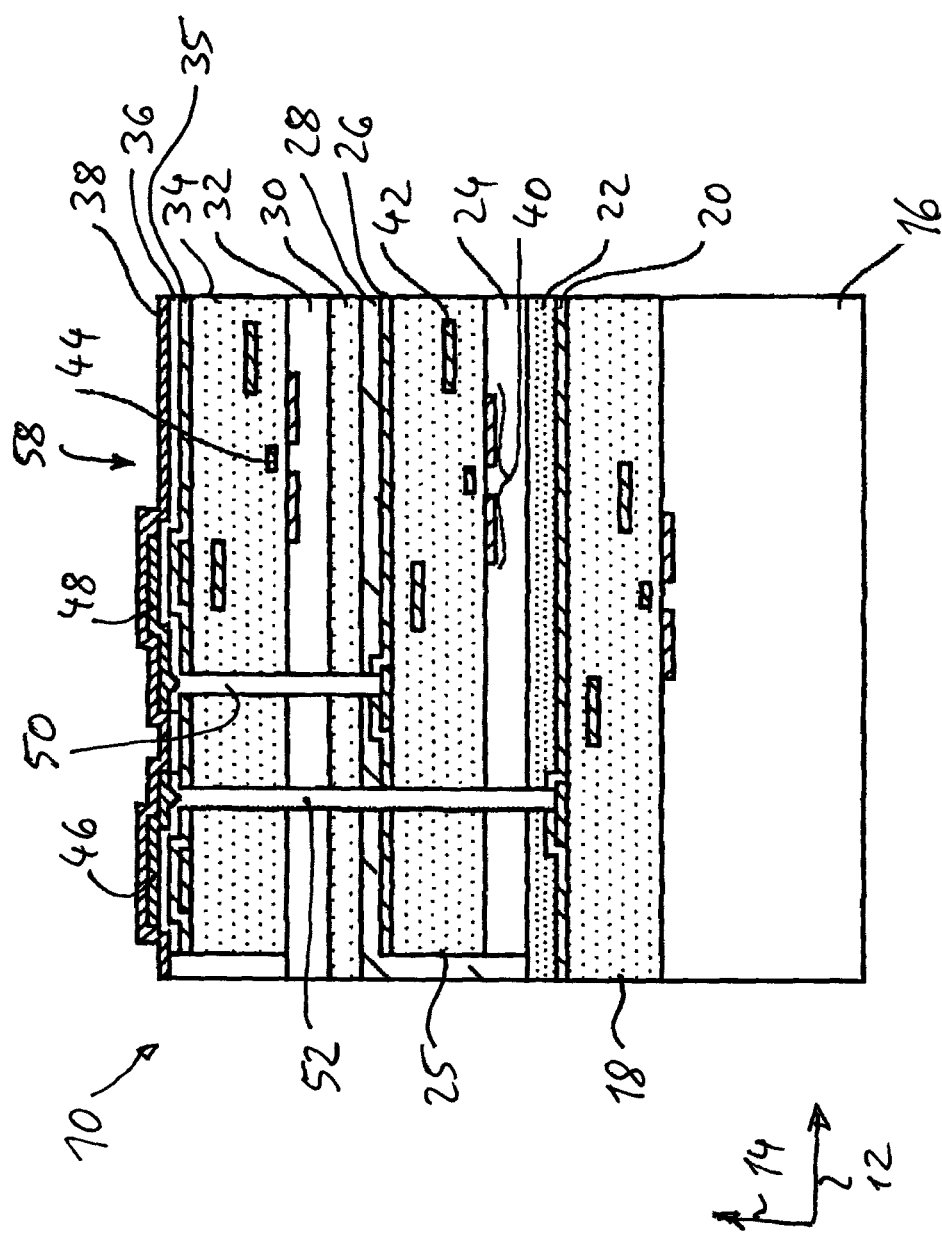
FIG. 1 is a detail of a cross-section, not to scale, of an exemplary electrical device, the electrical properties of which may be determined by means of the method according to the invention.

FIG. 1 shows a detail of a cross-section, not to scale, of an integrated circuit 10, which is integrated in a horizontal 12 and a vertical direction 14, i.e. three-dimensionally. Such an integrated circuit 10 has been described for example in DE 199 04 751 C1. Here, several material layers 18, 20, 22, 24, 25, 26, 28, 30, 32, 34, 35, 36, 38 are bonded, laminated, fused, soldered and/or sintered on to a substrate 16. In the example shown in the figure, layers 18, 20, 22, 24, 25, 26, 28, 30, 32, 34, 35, 36, 38 of different materials alternate. Typically there are provided between nonconductive layers 18, 22, 24, 25, 28, 30, 32, 34, 36, 38, conductor-path-like equipotential bodies 20, 26, 35, 40, 42, 44, by which electrical connections are made between connections of electrical components already integrated in the integrated circuit 10 and/or between connections 46, 48 of electrical components still to be mounted on the integrated circuit 10. The non-conductive layers 18, 22, 24, 25, 28, 30, 32, 34, 36, 38 have typically dielectric properties, therefore performing the function of dielectrics arranged between equipotential bodies 20, 26, 35, 40, 42, 44. Typically the integrated circuit 10 is provided with via holes 50, 52, which may be used as required, depending on the application, to make electrical connections between the different equipotential bodies 20, 26, 35, 40, 42, 44. An advantage of the integrated circuit 10 shown in the figure lies in the fact that a via hole between not directly adjacent equipotential bodies 20, 35 does not (more precisely: "not necessarily") require an electrical connection with one of the equipotential bodies 26, 40, 42, 44 located between the not directly adjacent equipotential bodies 20, 35.

Figure 2:
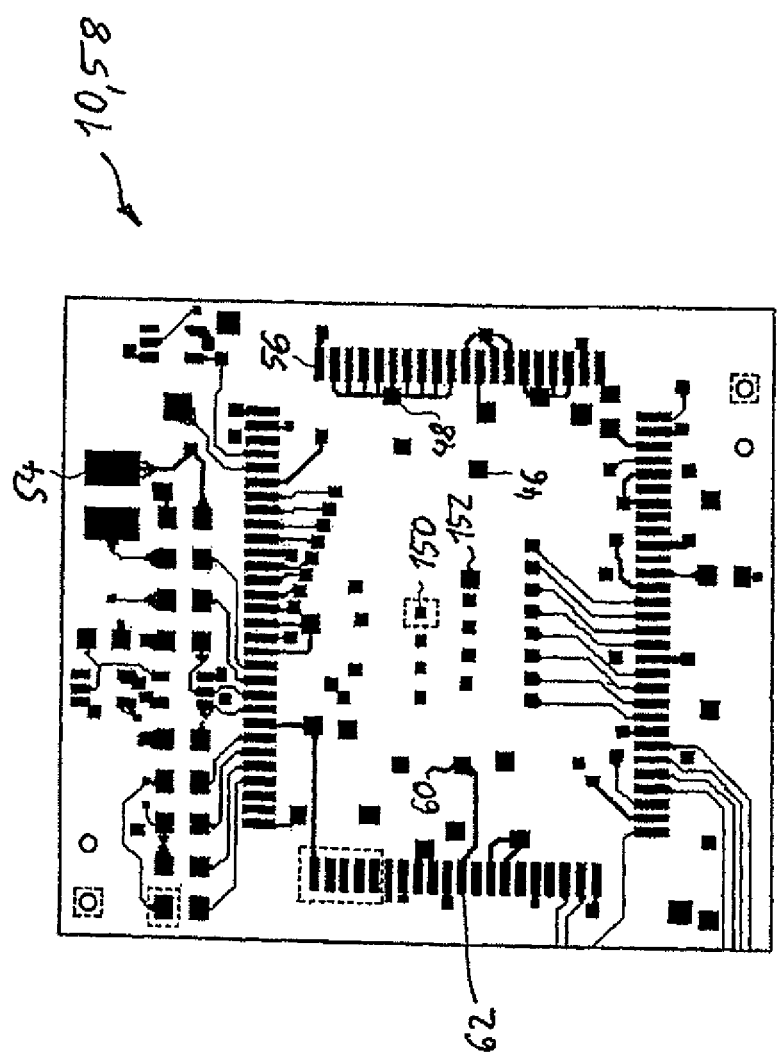
FIG. 2 is a view from above, not to scale, of the exemplary electrical device, the electrical properties of which may be determined by means of the method according to the invention.

FIG. 2 shows a view from above, not to scale, of the exemplary electrical device 10 of FIG. 1, the electrical properties of which may be determined by means of the method 103 according to the invention. The device 10 has, in an uppermost or almost uppermost layer, conductor-path-like equipotential bodies 54, 56 with connections. Also the via holes 50, 52 generally have in each case a contacting point 46, 48 brought out at an outer side 58 of the electrical device 10. Since the via holes 50, 52 are conductive to electrical current, they likewise represent equipotential bodies. Consequently each equipotential body 20, 46 and 26, 48 respectively, from which one or more via holes 52 or 50 is brought out to a surface 58 of the electrical device 10, forms with the via hole or holes 52 and/or 50 a common equipotential body 20, 46, 52 and/or 26, 48, 50. The equipotential bodies 20, 46, 52 and/or 26, 48, 50 may have diverse defects, which may be detected with an especially efficient use of time and resources by means of the method 103 according to the invention. For example two equipotential bodies 20, 46, 52 and 26, 48, 50 respectively may be connected to one another, i.e. may be connected conductively, in an unintended manner by means of a conductive foreign body, such as for example solder residue or a metal chip. Another type of possible defect occurs when not all parts of a (planned) equipotential body 20, 46, 52 and/or 26, 48, 50 are electrically conductively connected to one another. In this case, the parts of a planned individual equipotential body 20, 46, 52 or 26, 48, 50 represent in reality more than one equipotential body 20, 46, 52 or 26, 48, 50.

Figure 5:
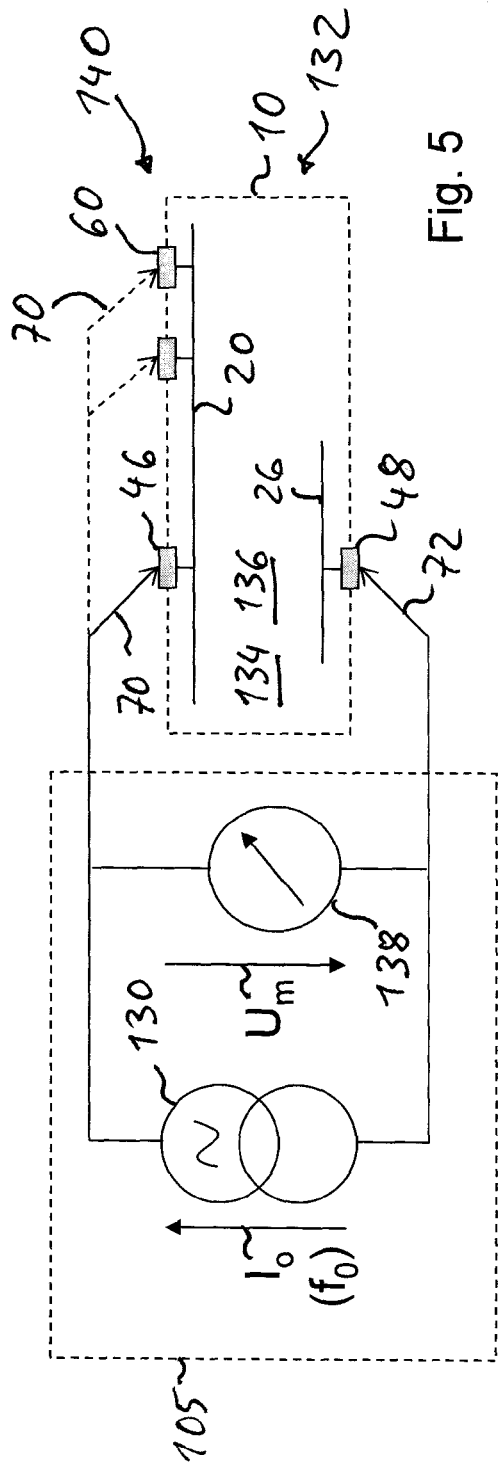
FIG. 5 is an equivalent circuit diagram to explain a first concept of the method according to the invention using the example of a two-pole measurement.
Figure 6:
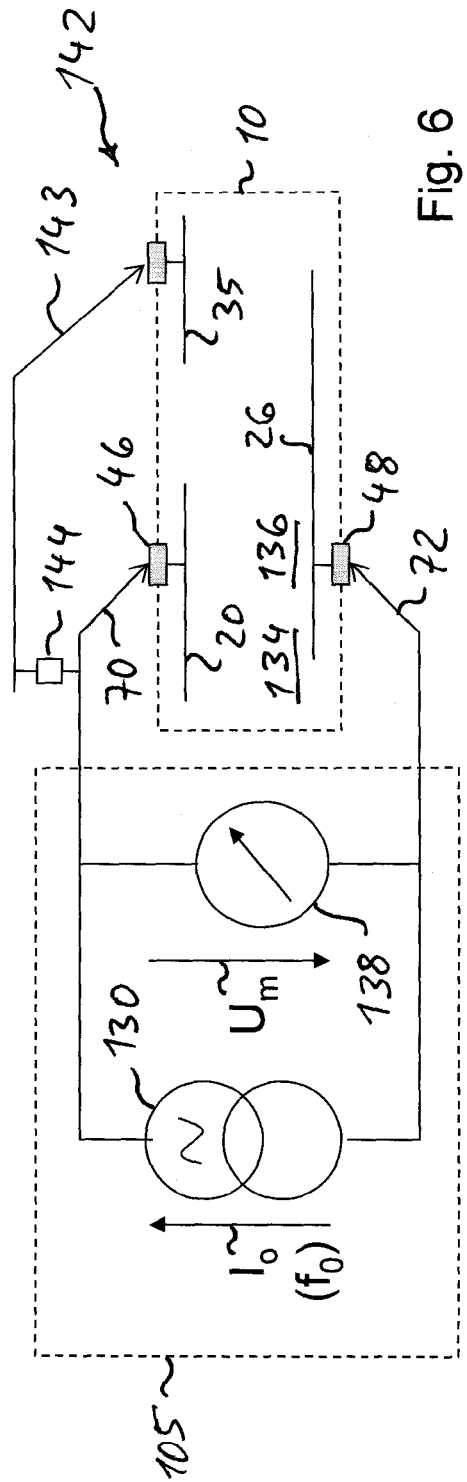
FIG. 6 is an equivalent circuit diagram to explain a second concept of the method according to the invention using the example of a two-pole measurement.

For reasons of space, for electrical reasons and/or for reasons of cost, it may be at least undesirable to bring out from the end of each branch of a star-like branched equipotential body 62, for measuring purposes, a connection at a surface 58 of the electrical device 10. For this and other reasons it is therefore advantageous to conduct a capacitance measurement between in each case two directly or indirectly adjacent equipotential bodies 20, 26. For this purpose an alternating voltage may be applied to both equipotential bodies 20, 26, so that the current resulting from this measuring set-up may then be measured. Another option, illustrated in FIGS. 5 and 6, is to inject into the capacitance C, which the two equipotential bodies 20, 26 form together, an alternating current $I_o$, and then to measure the applied voltage $U_m$. If a measuring voltage or measuring current source with a defined internal resistance is used, then an intermediate solution as it were is also possible, in order to infer a capacitance C which exists between the equipotential bodies 20, 26. So that the capacitance C between the equipotential bodies 20, 26 has an effect on the measured result which may be adequately and clearly distinguished from a spatial extension of the equipotential body, a measuring alternating current $U_m$ and measuring alternating current $I_o$ respectively should be used for measurement in which the measuring frequency $f_o$ used is higher, the lower the capacitance C which the two equipotential bodies 20, 26 form together. For equipotential body structures measuring just a few centimeters or even millimeters, measuring alternating voltages and measuring alternating currents $I_o$ in the high-frequency range are used for measurement. The higher the measuring frequency $f_o$, the greater is the importance for the measurement of the speed of propagation in the direction of a pointing vector of the electrical device wave between the two equipotential bodies 20, 26. In other words: the capacitance measurement increasingly becomes a high-frequency measurement on a waveguide 132 comprised of the two equipotential bodies 20, 26 and their surroundings. Since, at the outliers 60 of the equipotential bodies 20, 26, at branching points of the same, and at changes in width, thickness or spacing, and/or short-circuits of the equipotential bodies 20, 26, characteristic wave reflections occur, the intactness of the equipotential bodies 20, 26 may also be determined by means of a reflectometer-propagation time measurement. In the time range, however. such measurements are technically complex. Here, measurements in the frequency range may be simpler. For example, alternating voltages of at least two different frequencies $f_o$ from a high-frequency range may be applied to the pair of equipotential bodies 20, 26. Or the behavior of the equipotential body assembly 20, 26 may be determined by means of a wobbler or by pulses or periodic signals with high-frequency content. Or, by means of a noise generator 160 on the equipotential body assembly 20, 26, a high-frequency noise may be applied, so that checks may then be made using a spectral analyzer for the presence of characteristic resonances which, because of wave reflections of the outliers 60 of the equipotential bodies, occur at branching points of the latter and at points of change in width, thickness and/or spacing of the equipotential bodies 20, 26.

Irrespective of whether or not the method of capacitance measurement referred to is used, the capacitance and/or reflection and/or resonance measuring method may be used to determine not only a break in one of the two equipotential bodies 20, 26, but also a short-circuit between the two equipotential bodies. If one considers the equipotential body assembly 20, 26 from the low-frequency standpoint, then a short-circuit 20 also for a measuring alternating voltage or the measuring alternating current $I_o$ leads in principle to an infinitely low electrical resistance, i.e. to an infinitely high conductance. This also applies to the reactive component, i.e. the apparent resistance between the two equipotential bodies 20, 26. Up to this point, the equipotential body assembly 20, 26 has been regarded as two-pole, with the two connections 46, 48 in each case used for measurement. Provided that for measurement a further connection 60 is used, alternating or high-frequency four-pole measurements in the manner described above are also possible. The assembly with the two equipotential bodies 20, 26, 60 then forms a kind of high-frequency transformer. In the case of such a four-pole measurement, one of the two equipotential bodies may even be an external equipotential body 166, 168, which is not part of the electrical device 10.

Since it is especially difficult in the case of irregularly shaped equipotential bodies 20, 26 to calculate the two-pole or four-pole set properties, the following method is more rewarding for obtaining set values. For this purpose the two-pole and four-pole properties respectively are measured on a small number of for example 10 or 20 electrical devices 10, arbitrarily selected from a larger production batch. With an error rate which is not too high, typically only one to a maximum of three of the electrical devices 10 will have the same fault, so that the measured value of those electrical devices 10, which predominantly supply the same measured results for a specific measurement, are representative for those electrical devices which supply, at least for the specific measurement 110, measured values which are to be used as set measured values for all electrical devices 10. This method of determining set measured values for a specific measurement may be used for all equipotential body assemblies 132 to be tested, i.e. measurements 110 to be conducted.

Figure 3:
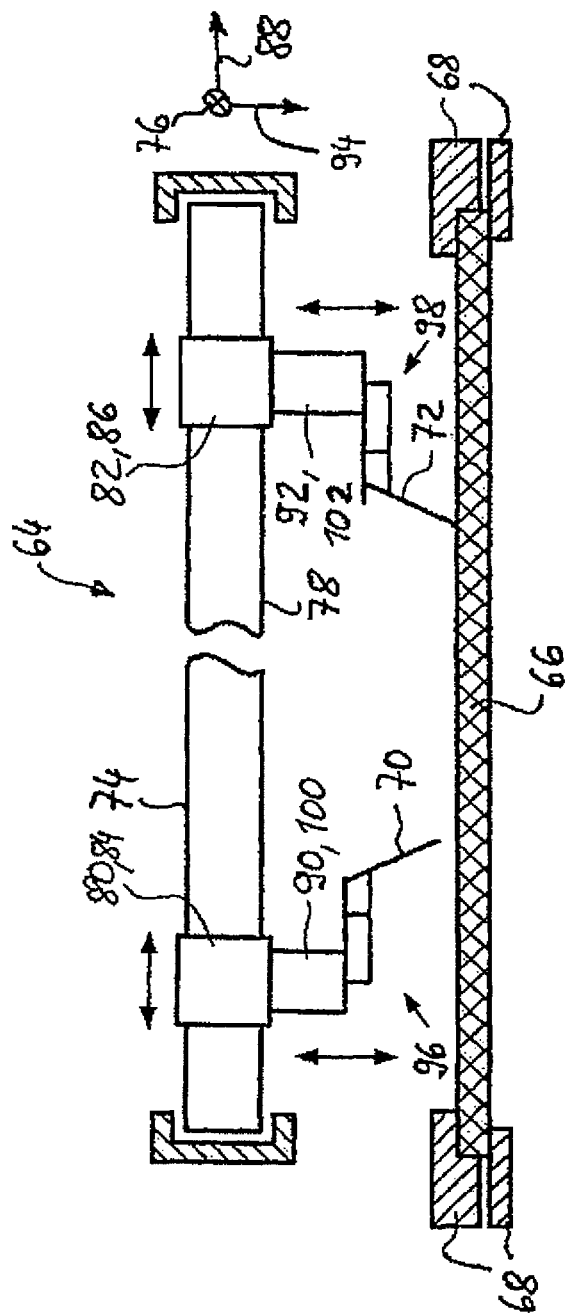
FIG. 3 is a cross-section through an exemplary measuring device for the taking of measurements of an electrical measured quantity on one of the exemplary electrical devices.

FIG. 3 shows a schematic side cross-sectional view, not to scale, through an exemplary measuring device 64 for the conduct of measurements 110 of electrical device measured quantities C of several electrical devices 10. The electrical device 10 may also for example be a printed circuit board 66. The figure shows how such an electrical device 64 is clamped in a measuring mount 68. The figure also shows two sensor probes 70, 72, wherein each sensor probe 70, 72 may be positioned by program control on at least some of the connection or measuring points 46, 48, 60 brought out on the surface 58 of the electrical device 10. The measuring device 10 may have a first cross rail 74 with the first sensor probe 70, with the first cross rail 74 being capable of program-controlled movement to and fro by means of a drive (not shown in the figure) in a first direction 76 (x-direction, plotted in the plane of the paper). The measuring device 64 may also have a similar second cross rail 78 with the second sensor probe 72. The relevant sensor probe 72 may be positioned, program-controlled, on the relevant cross rail 74, 78 on a slide 80 or 82 by means of a drive 84 or 86 in a second direction 88 (y-direction). Creation of the electrical contact between the sensor probe 70 or 72 and a specific connection 46, 48, 60 of the electrical device 10 is effected by a program-controlled drive 90 or 92, mounted on the slide 80 or 82, for a third direction of movement 94 (z-direction). A first development of the measuring device 64 sees alternatively or additionally a program-controlled tilting drive 96 or 98 for the sensor probe 70 or 72 so that, on account of the small mass moved, it can make and break especially quickly an electrical contact with the respective connection 46, 48, 60. A second development of the measuring device 64 sees additionally a program-controlled rotary drive 100 or 102. Consequently, with a sensor probe 70 or 72, several connections 46, 48, 60 of the electrical device 10 may be contacted from one cross rail position. For a two-pole measurement, two sensor probes 70, 72 with two outputs of a measuring electronics unit 105 are connected, with the measuring electronics unit 105 typically comprising a measuring alternating voltage or measuring alternating current source 130 and an electronic measuring device 138 for recording the electrical variable to be measured, such as a capacitance C or an imaginary part of a conductance G.

Figure 4:
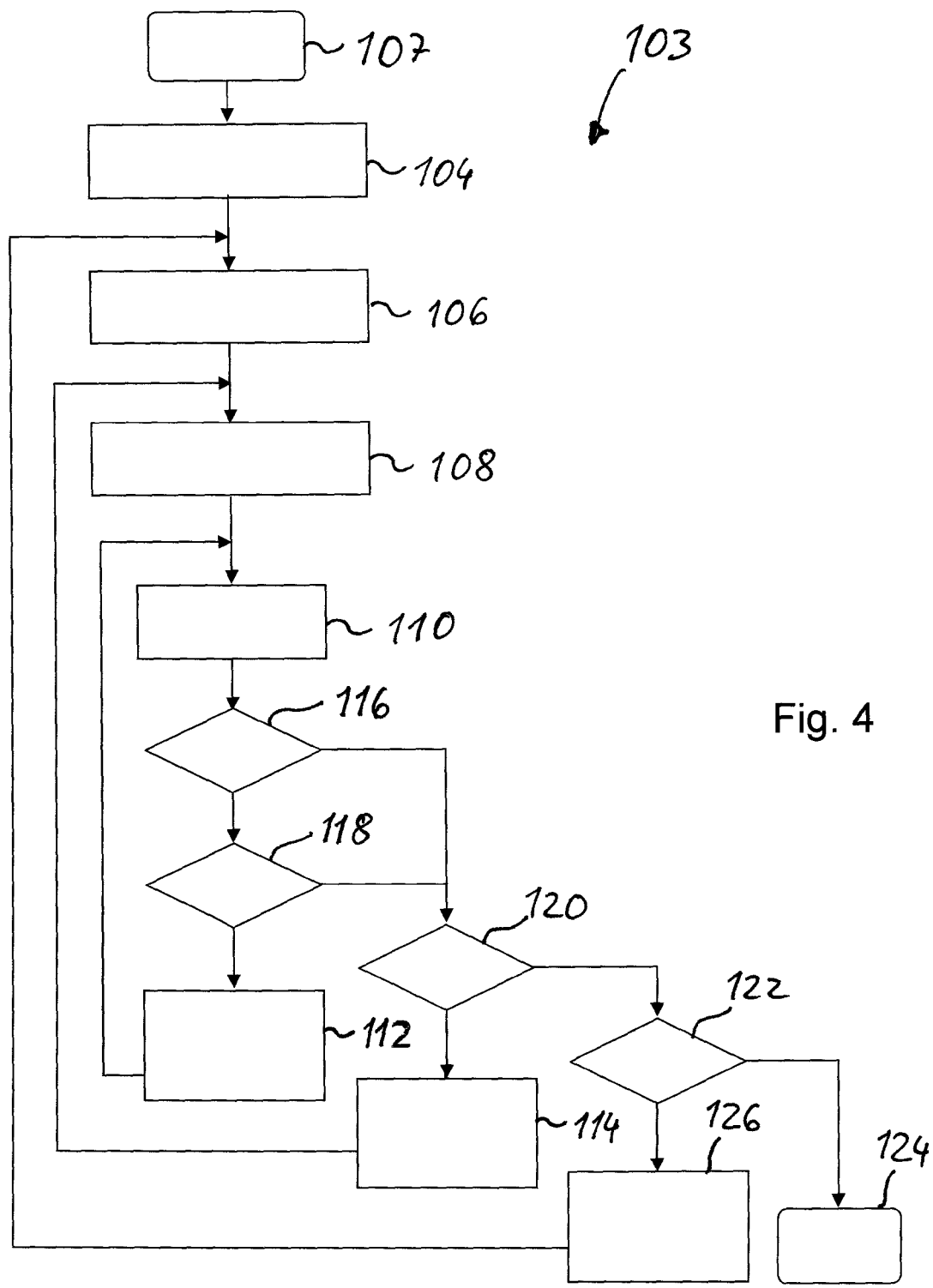
FIG. 4 is an exemplary flow chart to explain the method according to the invention for determining electrical properties of several electrical devices, as described below with the aid of FIGS. 1 and 2.

FIG. 4 shows an exemplary flow chart to explain the method 103 according to the invention for determining electrical properties of several electrical devices 10. The task of detecting a fault, or the freedom from defects of an electrical device is frequently associated with the localization of the fault. For the sake of clarity, this description concentrates on the task of detecting a fault, or the freedom from defects of an electrical device and is not so intensively concerned with the associated task of localizing a fault. After a program start 107, in initialization steps 104, 106, 108 for a first measurement 110, first of all a first device 10, of this a first equipotential body 20 and of this a first connection 46 are selected. A first electrical measurement 110, which may comprise several similar and/or different individual measurements, is then taken at the selected connection 46. For example a capacitance C of the equipotential body assembly 132 may be measured at different frequencies $f_o$ and/or as compared with different second equipotential bodies 26, 35. If this concludes all measurements 110 to be conducted on the equipotential body 20, then a check is made as to whether measurements 110 are still required on another equipotential body 26, 35 (step 120). If this is the case, then another equipotential body 26, 35 is selected for this purpose (step 114) and of this in turn a first connection 48 is selected for the next measurement 110 (step 108). If not all measurements 110 to be conducted on the first equipotential body 20 have yet been taken (step 116), a check is made as to whether a further measurement 110 on the first equipotential body 20 on another connection 60 would be likely to give additional information regarding the freedom from defects of the equipotential body 20 (step 118). The question of whether a further measurement is likely to lead to additional information is preferably answered by establishing whether a percentage minimum fault specific to an equipotential body is greater than a percentage measuring error of the measurement electronics 105 (the term "minimum fault" used here is explained below). If this is not the case, then a further measurement should give additional information, and a next connection 60 of the same equipotential body 20 is selected (step 112) and a further measurement is made (step 110). Otherwise another equipotential body 26, 35 is selected (step 114) and from this in turn a first connection 48 is chosen for the next measurement 110 (step 108). However, before a next equipotential body 26, 35 is selected (step 114), a check is first made as to whether measurements 110 have been made on all equipotential bodies (of the electrical device 10 which is under test) (step 120). If this is the case, a check is made as to whether all electrical devices 10 to be measured have in fact been measured (step 122). If this is the case, any concluding work is carried out and implementation of the measuring method 103 is then stopped (step 124). Otherwise a next electrical device 10, of this a first equipotential body 20 and of this a first connection 46 are selected to continue the measurements 110 (steps 126, 106, 108).

FIG. 5 shows an equivalent circuit diagram to explain a first concept of the method according to the invention using the example of a two-pole measurement 110. Here an alternating current source 130 is used to impress an alternating current $I_o$ of specific strength and frequency $f_o$ on an assembly 132 of two equipotential bodies 20, 26. In the intermediate space 134 between the two equipotential bodies 20, 26 is a dielectric 136, which is largely electrically insulated, so that the configuration 20, 136, 26 comprised of the two equipotential bodies 20, 26 and the dielectric 136 represents a capacitance C20. This capacitance C20 has for the impressed alternating current $I_o$ a specific alternating current conductance G, which determines an electrical potential difference $U_m$ between the equipotential bodies 20, 26. The potential difference $U_m$ between the two equipotential bodies 20, 26 is measured by a voltmeter 138. From the variable $I_o$ of the impressed alternating current $I_o$ and the level of the measured voltage drop $U_m$, the alternating current conductance G can be calculated, using a downstream measurement computer 164, by the formula $G=I_o/U_m$. From the alternating current conductance G and the frequency $f_o$ of the impressed current $I_o$, the capacitance C of the equipotential body assembly 20, 26 may in turn be calculated by the formula $C=G/(2\pi f_o)$. Naturally, the alternating current source $I_o$ typically has a voltage limit, so that the measurement set-up 140, 142 is not damaged by a power surge.

At low capacitance levels C20, lying for example in the pico or femtofarad range, a suitably high frequency $f_o$ should be used, in order to obtain voltage values $U_m$ in a voltage range still suitable for the measurement 110. Since within each equipotential body 20, 26 equipotential bonding takes place, then with not excessively high frequencies $f_o$ of up to around 1 MHz and with a defect-free equipotential body 20, 26 with adequate conductivity and fault-free contacting of the sensor probe 70 when the sensor probe 70 is placed on different connections 46, 60 of the equipotential body 20, no difference in measured results would be expected. i.e. the determined capacitance C20 of the equipotential body assembly 132 would always be equally high. The higher the frequency $f_o$, the more the electromagnetic wavelength corresponds to the magnitude of the extension of the equipotential bodies 20, 26 and the more the equipotential body assembly 132 behaves like a waveguide 132 i.e. the equipotential bonding in the equipotential body 20, 26 takes place at the speed with which the high-frequency electromagnetic wave is able to propagate in the waveguide 132 formed by the two equipotential bodies 20, 26. In this case, even with a defect-free and non-short-circuited equipotential body 20, quite different voltage drops $U_m$ may 20 be measured at different connections 46, 60 of the equipotential body 20. For example a measurement 110 at a wave node would give a voltage $U_m$ of zero volts, which according to the above formulae would correspond to an infinitely high capacitance value.

In the following it is now assumed that the frequency $f_o$ used is low enough for the described behavior of the equipotential body assembly 132 as a waveguide 132 to be disregarded. In the case of an intact equipotential body assembly 132, the measurement 110 would then always give the same capacitance value C20 at all connections 46, 60 of the same equipotential body 20. Therefore, in the case of an equipotential body 20 free from defects, in principle only the first measurement 110 on any of the connections 46, 60 will give additional information. For under the specified preconditions, the measured values at the other connections 60 and 46 respectively are in any case identical. This does not apply, however, if the equipotential body 20 has a break or a conductivity fault. In this case the measured values $U_m$ at the connections 46, 60 on one side of the break or conductivity fault are different from those on the other side of the break or conductivity fault. Consequently, in conventional methods, to be on the safe side, a measurement 110 is conducted on all connections 46, 60 of the equipotential body 20, resulting in a great expenditure of time for carrying out all the necessary measurements 110. According to the invention, only one capacitance measurement 110 is carried out on each equipotential body 20, 26, 35, provided this will have adequate significance for freedom from defects of the equipotential body 20. This makes use of the fact that a break or a conductivity fault in the equipotential body 20 always somehow affects the overall capacitance C20+C26 formed and measured by the second equipotential body 26 and indeed irrespective of the area of the equipotential body 20 in which the break or conductivity fault is located. If the measurement 110 of the actual value of the capacitance C20 of the equipotential body assembly 132 could be made free from tolerances and if the set value of the capacitance C20 of the equipotential body assembly 132 were tolerance-free then—because of the charge balancing in the equipotential body 20—a single capacitance measurement 110 would always be sufficient to provide a reliable statement as to whether the measured equipotential body 20 is free from defects. In practice, though, the measuring and set tolerances here are often of the same order of magnitude, so that a single measurement 110 is sometimes not enough. Nevertheless, in order to reduce the total time needed for all measurements 110 to be conducted, the invention makes a distinction between cases in which a single measurement 110 is adequate, and those in which further measurements 110 need to be made. In an extended equipotential body 20, a break at one edge of the equipotential body 20, 26, for example in the vicinity of a connection 46 of the same, has in percentage terms only a small influence on the measured capacitance measured value of the equipotential body assembly 132. If the percentage influence of this break is less than a tolerance of the capacitance measurement, then the fault will not generally be discovered by a single capacitance measurement. In the case of an equipotential body 20 of only limited extent, the change in measured value due to the break at the edge of the equipotential body 20 is frequently so great, that the fault may be found reliably with only one capacitance measurement. To distinguish between these two cases it is expedient to determine the size of the fault which can still reliably just be discovered, here described as the "minimum fault". An "absolute minimum fault", is for example the capacitance which an individual connection has, which is "broken" by its equipotential body. A "percentage minimum fault" is for example the ratio between the "absolute minimum fault" and the set capacitance of a fault-free equipotential body 20. Since the latter is dependent on the extent of the equipotential body 20, the percentage minimum fault is equipotential-body-specific. The minimum absolute fault may be measured at individual connections 150, 152 formed without equipotential bodies, or else calculated or estimated with the aid of CAD and material data. Taking into account a set capacitance which may be calculated from CAD data or determined by capacitance measurements on defect-free specimens 10, the specific percentage minimum fault may be determined for each equipotential body 20, 26, 35. If this specific percentage minimum fault is greater than a percentage measurement error of the measuring electronics, then a single measurement will be sufficient to determine the freedom from faults of the respective equipotential body 20, 26, 35, so that in process step 118 the route to select a next equipotential body is followed.

The potential minimum faults which may be measured at specific connections of the equipotential body are measurable at individual connections not connected to the equipotential body, or may be calculated or estimated using CAD data and material 20 data. They are thus available for certain types of connection. If the electrical device is a printed circuit board, then these types of connection may be via holes of a certain size and/or pad surfaces of a certain size, the minimum faults of which are determined solely by the type of connection. Accordingly, each of these connection types has a certain minimum capacitance which may represent the minimum fault during a capacitive measurement.

FIG. 6 shows an equivalent circuit diagram to explain a second concept of the method 103 according to the invention, using the example of a two-pole measurement 110. Here, in cases in which the tolerance range for an individual measurement 110 is not yet exhausted by a first equipotential body 20, in the same measuring operation an overall capacitance C20+C26 of the first 20 and third equipotential body 35 is measured by means of a third sensor probe 143 and an electrical bridge 144, thereby also checking simultaneously freedom from defects of the third equipotential body 35 in the same measuring operation.

FIG. 7 shows an example of a measuring set-up for a four-pole measurement, wherein an impressed electrical field is generated by means of a measuring voltage source 160 and an electrical potential difference $U_m$ is recorded by means of a voltmeter 162. The measuring voltage source 160 may be an alternating voltage source for a periodic, in particular sinusoidal voltage shape. It may however also be a voltage source with an output which supplies a stationary "input signal" such as noise. The voltmeter 162 may be an alternating voltmeter for a periodic, in particular sinusoidal 10 voltage shape. It may however also be a voltmeter 162, which is able to evaluate a multi-frequency or stationary "output signal" such as noise in the time or frequency range. In the latter case, the voltmeter 162 is typically a spectral analyzer 162. To automate the process, the measuring voltage source 160 and the voltmeter 162 or spectral analyzer 162 respectively may be controlled by a higher-level measuring computer 164, which converts the measured results into easily manageable variables—such as capacitance values C20, fault site coordinates, quality analyses. In the illustrated measuring set-up, the measuring voltage source 160 and the voltmeter 162 or spectral analyzer 162 respectively are connected to a common equipotential surface 166, but this is not essential.

FIG. 9 shows an example of a measuring set-up for a four-pole measurement, in which the four-pole is operated as a magnetically coupled high-frequency transformer. For this purpose a current is impressed through at least one section of the first equipotential body 20 by means of the measuring voltage source 160 or by means of the noise source 160. A voltage $U_m$ induced in the second equipotential body 26 is measured at two connections of the directly or indirectly adjacent second equipotential body 26 by means of the voltmeter 162 or the spectral analyzer 162.

FIGS. 8 and 10 differ from the measuring set-up shown in the respectively preceding figure in that the second equipotential surface 168 for generating the impressed electrical field is also an equipotential surface located outside the electrical device 10.

The invention claimed is:

1. Method of determining the electrical properties of an electrical device, wherein the method comprises the following steps: taking of at least one measurement of an electrical measured quantity at one or more brought-out electrical connections of each of several equipotential bodies of the electrical device,
   wherein measurement of the electrical measured quantity of certain equipotential bodies on at least one other brought-out electrical connection of the equipotential body concerned is not performed if a defect, which if appropriate is to be detected, of the relevant equipotential body in the area of this other connection, influences the electrical measured quantity more strongly than a tolerance of the measurement of this measured quantity.

2. Method according to claim 1, wherein a level of influencing of the electrical measured quantity during execution of the method is determined statistically by means of measurements on a preferably representative number of similar electrical devices.

3. Method according to claim 1, wherein a measuring tolerance to be used as a basis for the measurements is determined by means of a calibration measurement on at least one equipotential body with exemplary dimensions.

4. Method according to claim 2, wherein a measuring tolerance to be used as a basis for the measurements is determined by means of a calibration measurement on at least one equipotential body with exemplary dimensions.

5. Method according to claim 1, wherein initial measurements are made on the basis of an initial measuring tolerance, with a measuring tolerance statistically determined from the first measurements being used for subsequent measurements.

6. Method according to claim 1, wherein initial measurements are made on the basis of an initial measuring tolerance, with a measuring tolerance statistically determined from the first measurements being used for subsequent measurements.

7. Method according to claim 5, wherein during individual measurements in each case between two or more equipotential bodies, a temporary electrical connection is created by means of an electrical component and a joint measurement is made on the temporarily electrically connected equipotential bodies.

8. Method according to claim 7, wherein the electrical component substantially forms an electrical conductor.

9. Method according to claim 8, wherein the electrical component substantially forms an electrical conductor.

10. Method according to claim 1, wherein the measurements may include conductance and/or capacitance and/or propagation time measurements, and/or electrical field measurements and/or magnetic field measurements and/or electromagnetic field measurements.

11. Method according to claim 9, wherein the measurements may include conductance and/or capacitance and/or propagation time measurements, and/or electrical field measurements and/or magnetic field measurements and/or electromagnetic field measurements.

12. Method according to claim 1, wherein the measurements include the measurement of an amount, an angle, a real component and/or an imaginary component of a four-pole parameter of the conductance form, the resistance form, the chain form and/or the hybrid form.

13. Method according to claim 11, wherein the measurements include the measurement of an amount, an angle, a real component and/or an imaginary component of a four-pole parameter of the conductance form, the resistance form, the chain form and/or the hybrid form.

14. Method according to claim 1, wherein a set value of a measured value of the measurement and/or a tolerance of the measured value of the measurement during implementation of the method are determined statistically by means of measurements on a preferably representative number of similar electrical devices.

15. Method according to claim 13, wherein a set value of a measured value of the measurement and/or a tolerance of the measured value of the measurement during implementation of the method are determined statistically by means of measurements on a preferably representative number of similar electrical devices.

16. Method according to claim 1, wherein during measurement, the electrical device may be subjected to an electrical, a magnetic and/or an electromagnetic field, at least for a time and at least in some areas.

17. Method according to claim 15, wherein during measurement, the electrical device may be subjected to an electrical, a magnetic and/or an electromagnetic field, at least for a time and at least in some areas.

18. Method according to claim 16, wherein the field is an inhomogeneous field and/or a field which is stationary for at least part of the time and/or a field which is not stationary for at least part of the time.

19. Method according to claim 17, wherein the field is an inhomogeneous field and/or a field which is stationary for at least part of the time and/or a field which is not stationary for at least part of the time.

20. Method according to claim 16, wherein at least one of the equipotential bodies of the electrical device is connected to a current or voltage supply, in order to generate the electrical and/or electromagnetic field.

21. Method according to claim 19, wherein at least one of the equipotential bodies of the electrical device is connected to a current or voltage supply, in order to generate the electrical and/or electromagnetic field.

22. Method according to claim 1, wherein the level of influence on the electrical measured quantity is dependent on an expansion of volume and/or an expansion in area and/or and extension of length and/or on a specific conductivity and/or on a number of contact points and/or on a number of test points and/or on a number of holes in the equipotential body concerned and/or on a material encompassing the equipotential body concerned.

23. Method according to claim 21, wherein the level of influence on the electrical measured quantity is dependent on an expansion of volume and/or an expansion in area and/or and extension of length and/or on a specific conductivity and/or on a number of contact points and/or on a number of test points and/or on a number of holes in the equipotential body concerned and/or on a material encompassing the equipotential body concerned.

24. Method according to claim 1, wherein a test is first made to determine whether a fault, which it may be appropriate to detect, of the equipotential body in the area of this other connection, influences the electrical measured quantity more strongly than a tolerance of the measurement of this measured quantity and, if this is the case, no measurement is made at this other connection, while the test is made preferably before performing the first measurement of the measured quantities.

25. Method according to claim 23, wherein a test is first made to determine whether a fault, which it may be appropriate to detect, of the equipotential body in the area of this other connection, influences the electrical measured quantity more strongly than a tolerance of the measurement of this measured quantity and, if this is the case, no measurement is made at this other connection, while the test is made preferably before performing the first measurement of the measured quantities.

26. Device for determining electrical properties of an electrical device by means of a method according to claim 1.

27. Device for determining electrical properties of an electrical device by means of a method according to claim 25.

* * * * *